United States Patent
Macomber et al.

(10) Patent No.: US 7,519,789 B1
(45) Date of Patent: Apr. 14, 2009

(54) METHOD AND SYSTEM FOR DYNAMICALLY SELECTING A CLOCK EDGE FOR READ DATA RECOVERY

(75) Inventors: Robert L. Macomber, Portland, ME (US); David J. Fensore, New Gloucester, ME (US)

(73) Assignee: National Semiconductor Corporation, Santa Clara, CA (US)

(*) Notice: Subject to any disclaimer, the term of this patent is extended or adjusted under 35 U.S.C. 154(b) by 588 days.

(21) Appl. No.: 11/039,366

(22) Filed: Jan. 20, 2005

(51) Int. Cl.
   *G06F 1/26* (2006.01)
   *H03K 5/19* (2006.01)
   *G11C 7/00* (2006.01)
(52) U.S. Cl. .......................... 711/167; 327/24; 365/221
(58) Field of Classification Search ............ None
   See application file for complete search history.

(56) References Cited

U.S. PATENT DOCUMENTS

| | | | | |
|---|---|---|---|---|
| 6,636,080 B2 * | 10/2003 | Soda | ............................ | 327/24 |
| 6,651,231 B2 * | 11/2003 | Morikawa | ....................... | 716/6 |
| 6,798,708 B2 * | 9/2004 | Niwa et al. | ................... | 365/221 |
| 2005/0105907 A1 * | 5/2005 | Richardson et al. | ........... | 398/79 |
| 2006/0035650 A1 * | 2/2006 | Amberny et al. | ............ | 455/462 |

FOREIGN PATENT DOCUMENTS

WO   WO 2004023768 A1 *   3/2004

* cited by examiner

*Primary Examiner*—Hyung S Sough
*Assistant Examiner*—Duc T Doan

(57) ABSTRACT

A method for dynamically selecting a clock edge for recovering read data received from a slave at a master is provided that includes determining whether an internal clock signal is high when a first bit of read data is received at the master. One of a falling edge and a rising edge of the internal clock signal are selected for recovering the read data based on the determination of whether the internal clock signal is high when the first bit of read data is received at the master.

20 Claims, 7 Drawing Sheets

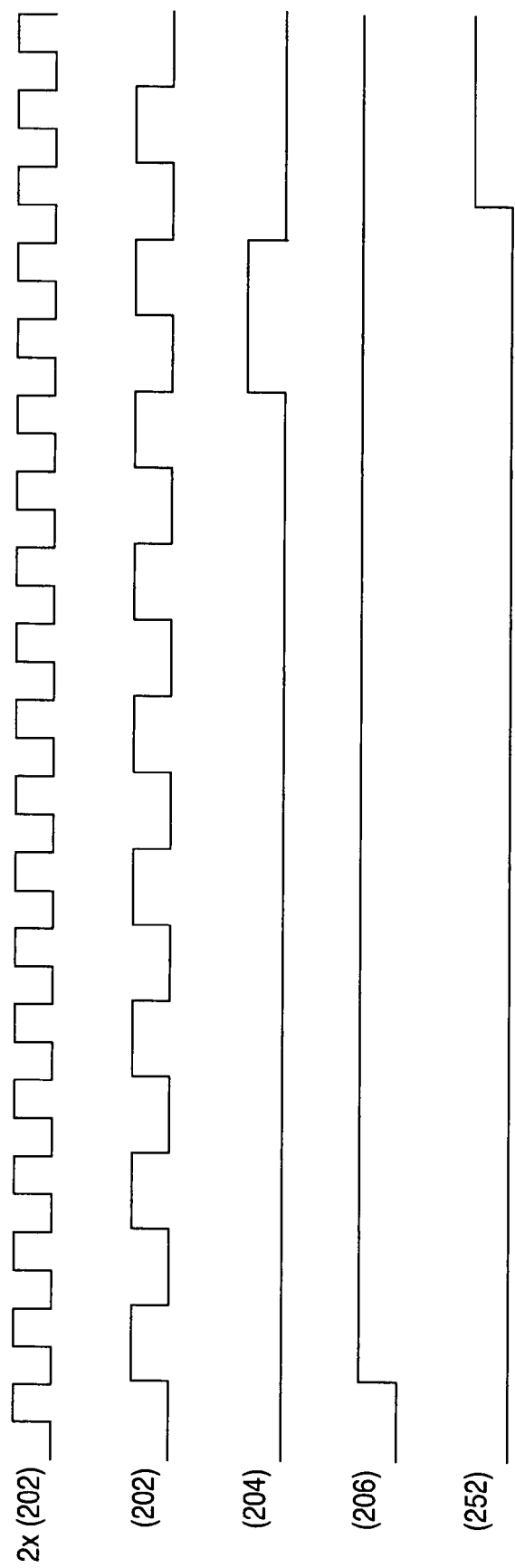

US 7,519,789 B1

METHOD AND SYSTEM FOR DYNAMICALLY SELECTING A CLOCK EDGE FOR READ DATA RECOVERY

TECHNICAL FIELD OF THE INVENTION

The present invention relates generally to communication systems and, more particularly, to a method and system for dynamically selecting a clock edge for read data recovery.

BACKGROUND OF THE INVENTION

Conventional general purpose bus protocols for master-slave interfaces typically have the master recovering read data received from the slave over the bus with either the rising edge or the falling edge of a clock. However, delays introduced during transactions across the interface may cause problems with recovering the read data.

To solve these problems, conventional systems generally use one of two solutions. One solution involves tuning the interface, which may be done if the range of delays is small. The other solution involves selecting either the rising edge or the falling edge to use in recovering read data, which may be done if the delay is less than a clock period. However, when the delays are too long and/or are highly variable, these solutions may be inadequate and the master may be unable to recover the read data.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which:

FIGS. 2B and 2C are timing diagrams associated with the edge selector of FIG. 2A;

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged master-slave interface.

Figure 1:
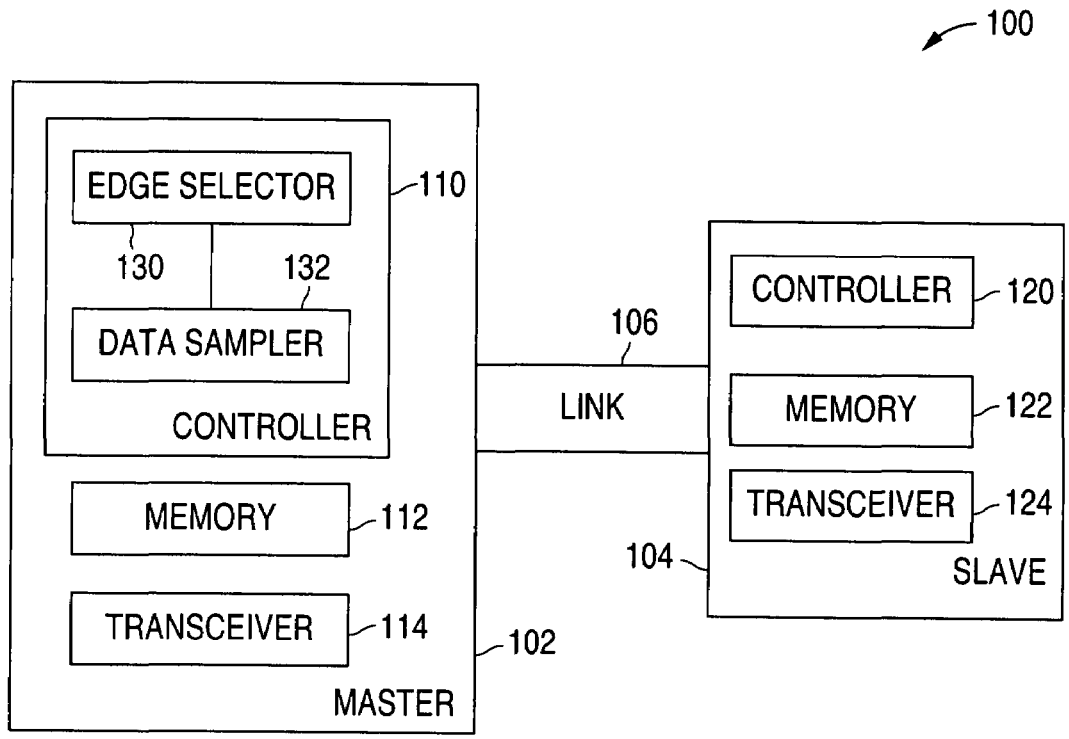
FIG. 1 is a block diagram illustrating a master-slave interface operable to provide dynamic selection of a clock edge for read data recovery in accordance with one embodiment of the present invention.

FIG. 1 is a block diagram illustrating a master-slave interface 100 operable to allow a master 102 to dynamically select a clock edge for recovering read data received at the master 102 from a slave 104 by way of a link 106 in accordance with one embodiment of the present invention. The interface 100 may be implemented as part of a mobile communication system, a file transfer system, or any other suitable system that uses a master-slave configuration.

As one example of a particular embodiment, the interface 100 may be implemented in a mobile telephone. For this embodiment, the master 102 may comprise a baseband processor, the slave 104 may comprise a display, and the link 106 may comprise a flex interconnect. For other embodiments, the interface 100 may comprise a CPU mode, such as an i80 or m68, or any other suitable type of interface.

For the illustrated embodiment, the interface 100 comprises one master 102 and one slave 104. However, it will be understood that the interface 100 may comprise any suitable number of masters 102 and any suitable number of slaves 104 for each master 102 without departing from the scope of the present invention.

The master 102 is operable to communicate with the slave 104 over the link 106. The master 102 is also operable to control the flow of data over the link 106. The slave 104 is operable to respond to the master 102 over the link 106. The link 106 may comprise a point-to-point, bidirectional half duplex link, a unidirectional link, or other suitable type of link based on the application in which the interface 100 is implemented.

According to the illustrated embodiment, the master 102 comprises a master controller 110, a master memory 112, and a master transceiver 114. Similarly, the slave 104 comprises a slave controller 120, a slave memory 122, and a slave transceiver 124. It will be understood that the master 102 and/or the slave 104 may comprise any other suitable components without departing from the scope of the present invention.

Among other things, the master controller 110 is operable to provide write data from the master memory 112 to the slave 104 over the link 106 for storage in the slave memory 122. The master controller 110 is also operable to request that the slave 104 provide read data from the slave memory 122 to the master 102 over the link 106 for storage in the master memory 112 and/or for other suitable uses.

The master memory 112 may comprise a table, database and/or any other suitable type of data store that is operable to store data for the master 102. The slave memory 122 may comprise a table, database and/or any other suitable type of data store that is operable to store data for the slave 104.

The master transceiver 114 is operable to send write data from the master memory 112 over the link 106 to the slave 104 and is also operable to receive read data from the slave 104 over the link 106. The slave transceiver 124 is operable to send read data from the slave memory 122 over the link 106 to the master 102 and is also operable to receive write data from the master 102 over the link 106 for storage in the slave memory 122.

As described in more detail below in connection with FIGS. 2A-2C, the master controller 110 comprises an edge selector 130 that is operable to select either the rising or the falling edge of a clock signal for recovering read data received over the link 106 from the slave 104 for each individual operation. In addition, as described in more detail below in connection with FIGS. 3A-3C, the master controller 110 also comprises at least one data sampler 132 that is coupled to the edge selector 130 and is operable to receive the selection from the edge selector 130 in order to recover the read data using the edge of the clock that has been selected by the edge selector 130. The number of data samplers 132 corresponds to the number of data signals that may be sent across the link 106 simultaneously.

Figure 2A:
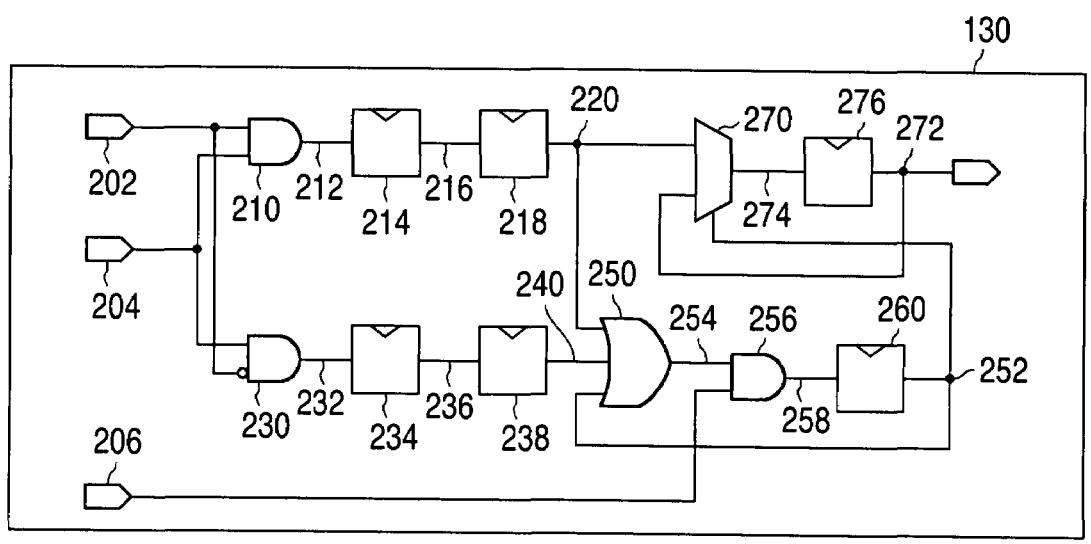
FIG. 2A is a logic diagram illustrating the edge selector of FIG. 1 in accordance with one embodiment of the present invention.

FIG. 2A is a logic diagram illustrating the edge selector 130 in accordance with one embodiment of the present invention. For this embodiment, the edge selector 130 comprises a plurality of AND gates and flip-flops, in addition to a multiplexer and an OR gate. However, it will be understood that the edge selector 130 may be implemented using different configurations of logic gates and other suitable components without departing from the scope of the present invention.

For the illustrated embodiment, the edge selector 130 is operable to receive as inputs an internal clock signal 202, a data signal 204, and a read signal 206. The internal clock signal 202 corresponds to the clock signal used by the master controller 110 for its normal operations. For one embodiment, the internal clock signal 202 may be in the range of 3 MHz to 80 MHz; however, it will be understood that the internal clock signal 202 may comprise any suitable frequency or range of frequencies without departing from the scope of the present invention.

The data signal 204 corresponds to one of the one or more data signals that may be sent across the link 106. The read signal 206 is a signal that may be high when read data is being received and low otherwise. It will be understood that the interface 100 and the controller 110 may be designed such that the read signal 206 is low when read data is being received and high otherwise without departing from the scope of the present invention.

The first bit of any incoming read data (a Start bit) comprises an opposite value as compared to a value corresponding to an idle condition on the link 106. For the illustrated embodiment, the first bit of any incoming read data is high. Thus, for this embodiment, a low value corresponds to an idle condition on the link 106. However, it will be understood that a high value may correspond to an idle condition and the Start bit of the read data may comprise a low value without departing from the scope of the present invention.

In operation, according to one embodiment, a first AND gate 210 of the edge selector 130 ANDs the internal clock signal 202 with the data signal 204 to generate a signal 212. The signal 212 is received as an input at a first flip-flop 214. Based on the signal 212, the first flip-flop 214 generates a delayed signal 216 as an input for a second flip-flop 218. The second flip-flop 218 generates a delayed signal 220 based on the signal 216.

A second AND gate 230 of the edge selector 130 ANDs an inversion of the internal clock signal 202 with the data signal 204 to generate a signal 232. The signal 232 is received as an input at a third flip-flop 234. Based on the signal 232, the third flip-flop 234 generates a delayed signal 236 as an input for a fourth flip-flop 238. The fourth flip-flop 238 generates a delayed signal 240 based on the signal 236.

Figure 2B:
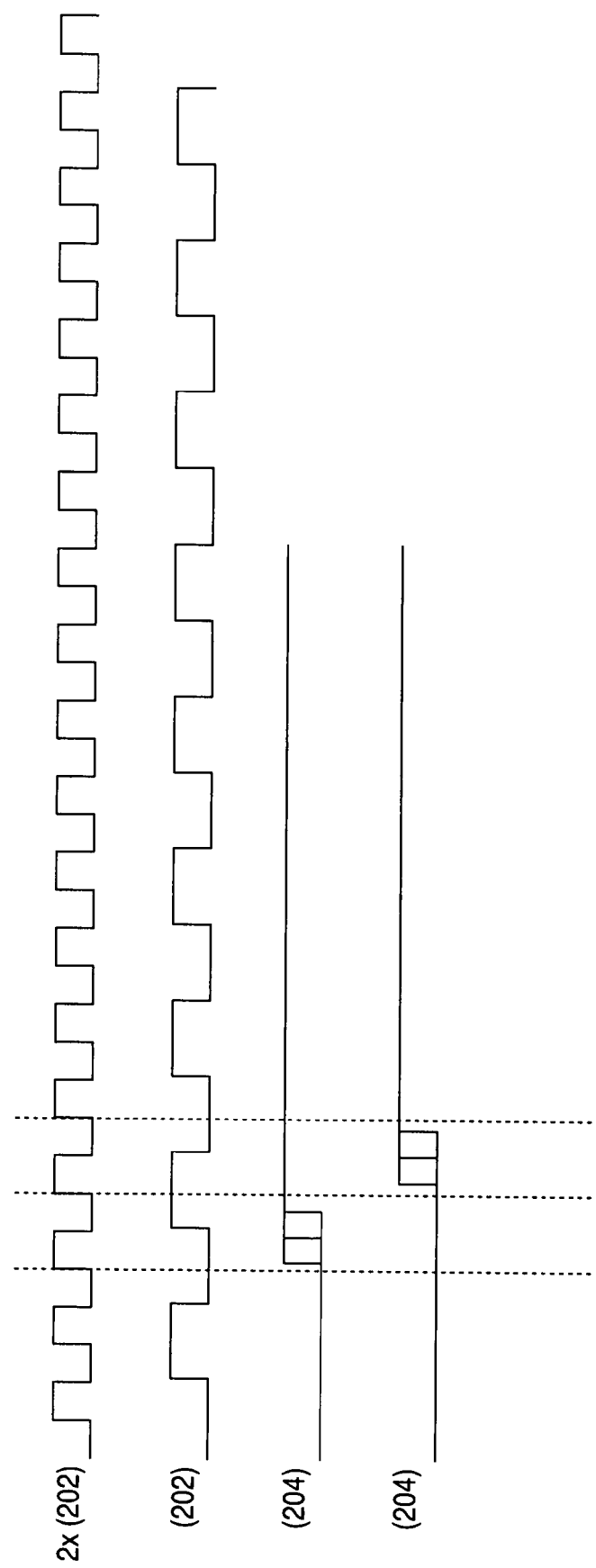

The flip-flops 214, 218, 234 and 238 each operate based on a selector clock signal (not shown in FIG. 2A but shown in FIGS. 2B-2C). The selector clock signal is approximately twice the frequency as the internal clock signal 202. According to one embodiment, the controller 110 generates the selector clock signal based on the internal clock signal 202. Alternatively, the edge selector 130 generates the selector clock signal based on the internal clock signal 202.

The OR gate 250 of the edge selector 130 comprises a three-input OR gate that ORs the signals 220 and 240, along with a feedback signal 252, to generate a signal 254. A third AND gate 256 ANDs the signal 254 with the read signal 206 to generate a signal 258 for a fifth flip-flop 260. The fifth flip-flop 260 generates the feedback signal 252 based on the signal 258.

The multiplexer 270 of the edge selector 130 receives the signal 220 from the second flip-flop 218 and a fall signal 272 and, based on a selection by the feedback signal 252, generates a signal 274 as an input for a sixth flip-flop 276. The sixth flip-flop 276 generates the fall signal 272 based on the signal 274.

The fall signal 272 is a signal that may be high when the edge selector 130 has selected the falling edge of the internal clock signal 202 to be used by the master controller 110 for recovering read data from the slave 104 and low when the edge selector 130 has selected the rising edge of the internal clock signal 202 to be used by the master controller 110 for recovering read data from the slave 104. However, it will be understood that the interface 100 and the controller 110 may be designed such that the fall signal 272 is low when a falling edge is to be used and high when a rising edge is to be used without departing from the scope of the present invention.

The data signal 204 received as an input at the edge selector 130 is ANDed with the internal clock signal 202 and its inversion and then separately sampled by the first and third flip-flops 214 and 234 using the selector clock signal. The second and fourth flip-flops 218 and 238 are used to register each data sample a second time with the selector clock signal in order to avoid metastability problems.

The falling edge of the internal clock signal 202 is selected by the edge selector 130 for recovering the read data if the Start bit arrives in the data signal 204 when the internal clock signal 202 is high. Conversely, the rising edge of the internal clock signal 202 is selected by the edge selector 130 for recovering the read data if the Start bit arrives in the data signal 204 when the internal clock signal 202 is low.

For the illustrated embodiment, when there is an active read, the read signal 206 is high. However, when the read signal 206 goes low, the edge selector 130 is re-armed. Thus, the edge selection may be performed by the edge selector 130 for each individual read operation.

Although the illustrated embodiment provides for two flip-flops 214/218 and 234/238 between each of the AND gates 210 and 230 and the OR gate 250, it will be understood that any suitable number of flip-flops may be included between these gates without departing from the scope of the present invention.

FIG. 2B is a timing diagram associated with the edge selector 130 of FIG. 2A. In FIG. 2B, the top signal represents the selector clock signal used by the flip-flops 214, 218, 234 and 238. The selector clock signal is approximately twice the frequency as the internal clock signal 202, which is the second signal shown in FIG. 2B. In addition, the last two signals shown in FIG. 2B represent different data signals 204, and the edge selector 130 is operable to select either the rising edge or the falling edge of the clock signal 202 for recovering data based on when the Start bit arrives in the data signal 204.

FIG. 2C is another timing diagram associated with the edge selector 130 of FIG. 2A. In FIG. 2C, the top signal represents the selector clock signal used by the flip-flops 214, 218, 234 and 238. The second signal represents the internal clock signal 202. The third and fourth signals represent a data signal 204 and a read signal 206. The read signal 206 goes high and stays high when read data is being captured (which could depend upon the length of the serial data packet being received). The read signal 206 may go low between read operations. The last signal in FIG. 2C represents the feedback signal 252.

Figure 3A:
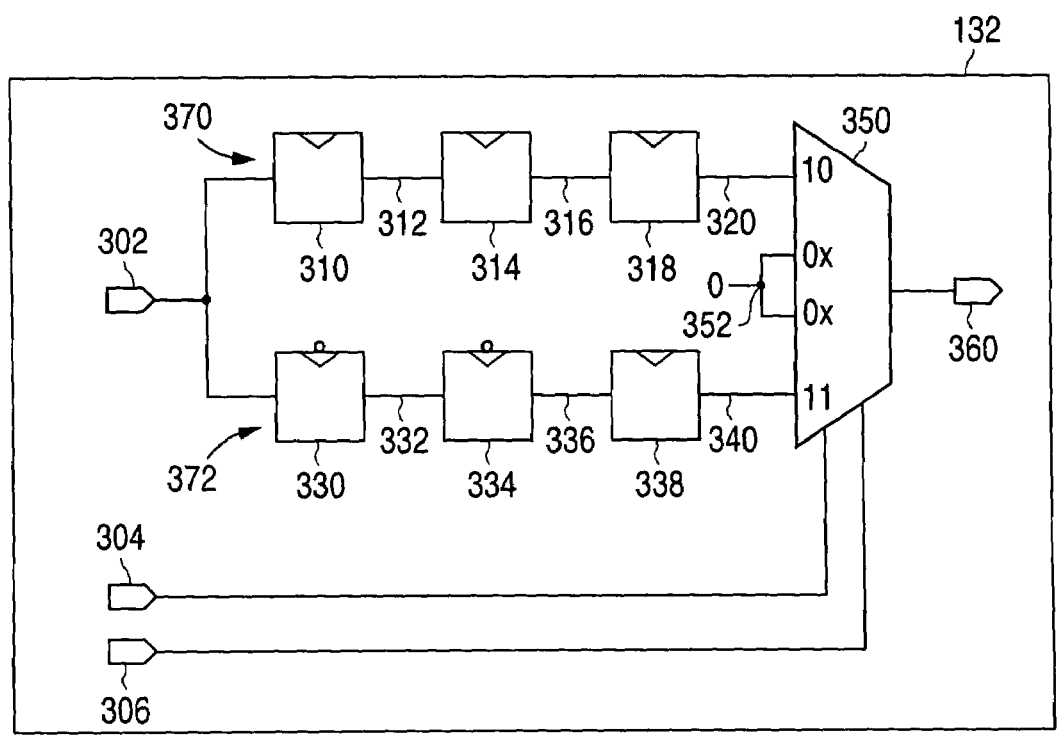
FIG. 3A is a logic diagram illustrating the data sampler of FIG. 1 in accordance with one embodiment of the present invention.

FIG. 3A is a logic diagram illustrating the data sampler 132 in accordance with one embodiment of the present invention. For this embodiment, the data sampler 132 comprises a plurality of flip-flops and a multiplexer. However, it will be understood that the data sampler 132 may be implemented using different configurations without departing from the scope of the present invention. Each of the flip-flops in the data sampler 132 operates based on the internal clock signal 202 (not shown in FIG. 3A).

For the illustrated embodiment, the data sampler 132 is operable to receive as inputs a data signal 302, a read signal 304, and a fall signal 306. The data signal 302 corresponds to one of the one or more data signals that may be sent across the link 106, such as the data signal 204. It will be understood that the data sampler 132 may be replicated for each of the data signals. Thus, for example, if two data signals may be sent across the link 106 simultaneously, the controller 110 comprises two data samplers 132, one for each data signal. The read signal 304 corresponds to the read signal 206, and the fall signal 306 corresponds to the fall signal 272.

In operation, according to one embodiment, a first flip-flop 310 of the data sampler 132 receives the data signal 302. Based on the data signal 302, the first flip-flop 310 generates a delayed signal 312 as an input for a second flip-flop 314. Based on the signal 312, the second flip-flop 314 generates a delayed signal 316 as an input for a third flip-flop 318. Based on the signal 316, the third flip-flop 318 generates a delayed signal 320.

A fourth flip-flop 330 of the data sampler 132 also receives the data signal 302. Based on the data signal 302, the fourth flip-flop 310 generates a delayed signal 332 as an input for a fifth flip-flop 334. As illustrated in FIG. 3A, the fourth and fifth flip-flops 330 and 334 are clocked with the inversion of the internal clock signal 202. Based on the signal 332, the fifth flip-flop 334 generates a delayed signal 336 as an input for a sixth flip-flop 338. Based on the signal 336, the sixth flip-flop 338 generates a delayed signal 340.

The multiplexer 350 receives the signals 320 and 340 as two inputs, along with a low signal 352 at two additional inputs. Then, based on the read signal 304, the multiplexer 350 may be activated and, based on the fall signal 306, either the signal 320 or the signal 340 is selected to generate a recovered read data signal 360. When the read signal 304 is low, the multiplexer 350 is essentially deactivated, selecting the low signal 352 as an output 360. When the read signal 304 is high, the multiplexer 350 selects the signal 320 when the fall signal 306 is low and selects the signal 340 when the fall signal 306 is high.

It will be understood that either the signal 320 or the signal 340 may be otherwise selected as the recovered read data 360 without departing from the scope of the present invention. For example, the multiplexer 350 may select the low signal 352 when the read signal 304 is high and one of the other signals 320 or 340 when the read signal 304 is low.

In this way, the data sampler 132 provides two parallel pipelines 370 and 372: a rising edge pipeline 370 comprising flip-flops 310, 314 and 318 and a falling edge pipeline 372 comprising flip-flops 330, 334 and 338. This allows the read data 304 to be sampled on the rising edge of the internal clock signal 202 when the fall signal 306 is low, resulting in the signal 320 being recovered as read data 360, while also allowing the read data 304 to be sampled on the falling edge of the internal clock signal 202 when the fall signal 306 is high, resulting in the signal 340 being recovered as read data 360.

For the embodiment in which the Start bit is a 1, the read signal 304 is kept low until the pipelines 370 and 372 are filled with 0s in order to avoid seeing a false Start bit. The read signal 304 then transitions to high before the Start bit reaches the flip-flops 318 and 338.

The delays through the flip-flops 310, 314, 330 and 334 provide the edge selector 130 with sufficient time to determine whether to use the rising edge or the falling edge of the internal clock signal 202 and to provide the corresponding fall signal 306 to the data sampler 132 for use in the multiplexer 350 before the data sampler 132 attempts to recover the read data 302. Thus, although the illustrated embodiment provides for two delay flip-flops 310/314 and 330/334 in each pipeline 370 and 372 of the data sampler 132, it will be understood that any suitable number of delay flip-flops may be included in each pipeline 370 and 372 in order to provide a sufficient delay in the read data 302 for the edge selection process to be performed. The flip-flops 318 and 338 allow the signals 320 and 340 to be synchronized to the internal clock signal 202 in order to communicate properly with other logic in the master 102.

Figure 3B:
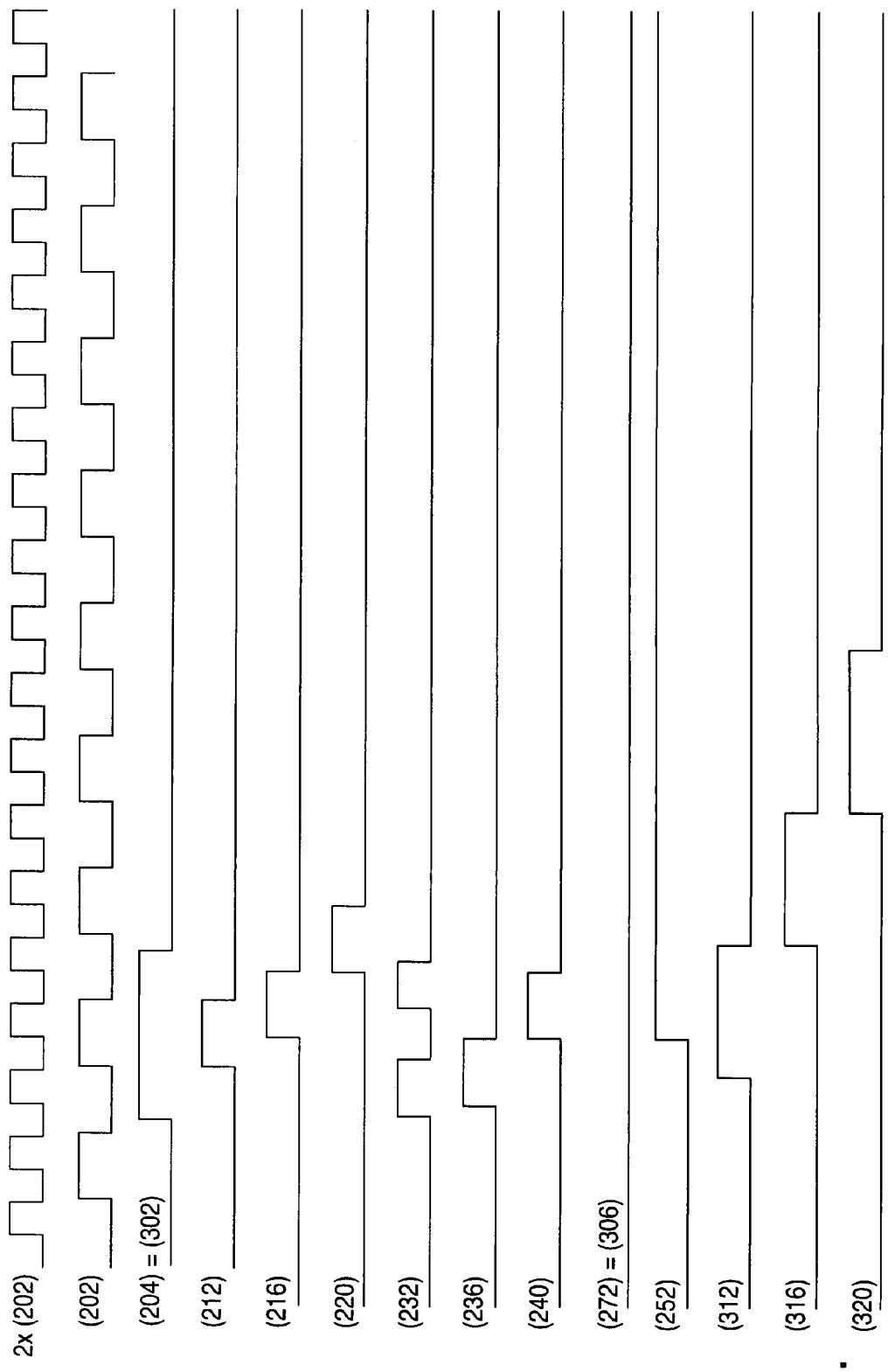
FIGS. 3B and 3C are timing diagrams associated with the edge selector of FIG. 2A and the data sampler of FIG. 3A.
Figure 3C:
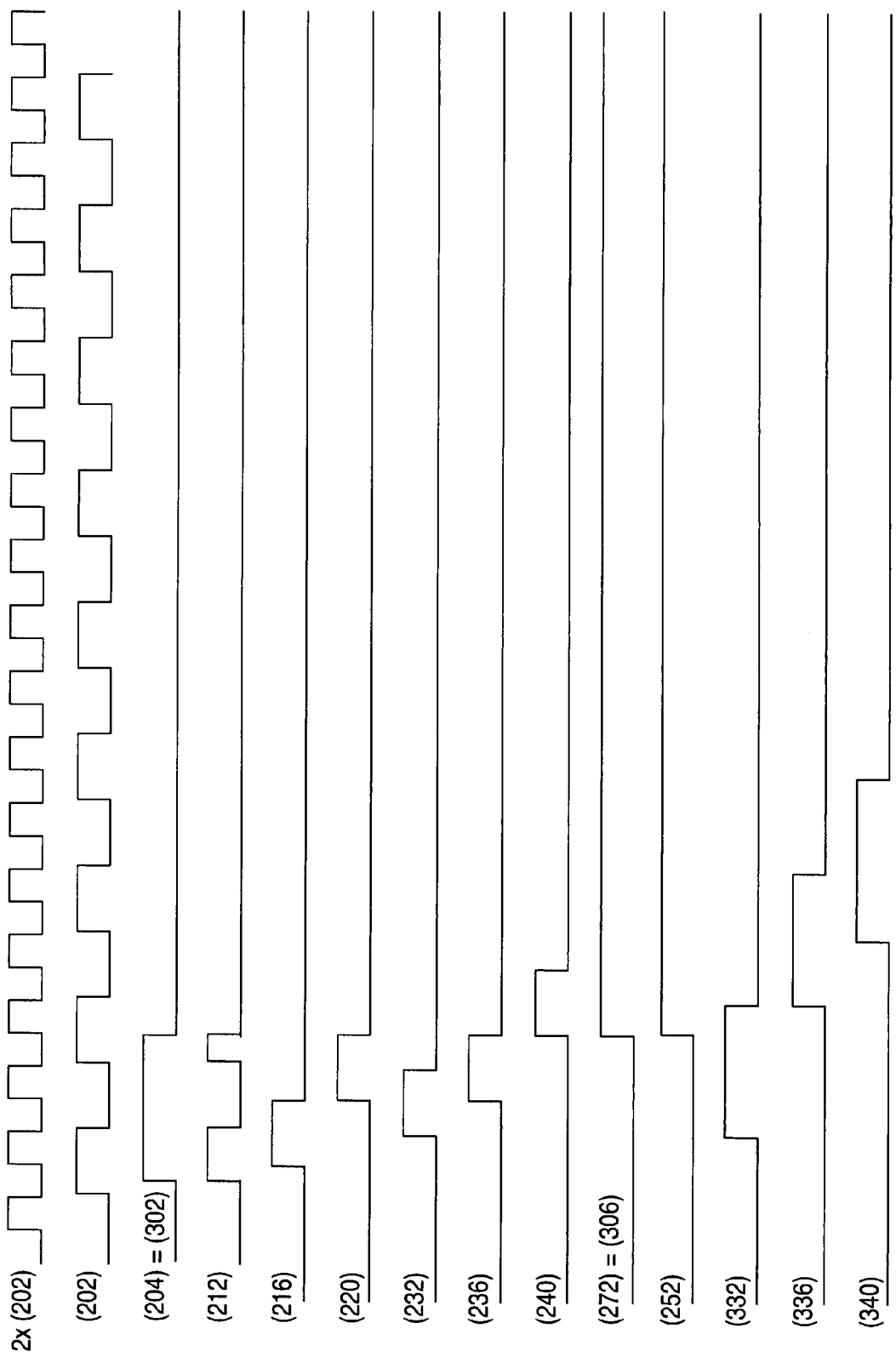

FIGS. 3B and 3C are timing diagrams associated with the edge selector 130 of FIG. 2A and the data sampler 132 of FIG. 3A. In particular, FIG. 3B is associated with the sampling of data using the rising edge of the clock signal 202, and FIG. 3C is associated with the sampling of data using the falling edge of the clock signal 202. FIGS. 3B and 3C both illustrate the internal clock signal 202 and the selector clock signal (which is approximately twice the frequency as the internal clock signal 202). FIGS. 3B and 3C also illustrate the data signal 204/302 received by the edge selector 130 and the data sampler 132. FIGS. 3B and 3C further illustrate the signals 212-220 along the upper path in the edge selector 130 and the signals 232-240 along the lower path in the edge selector 130. In addition, FIGS. 3B and 3C illustrate the fall signal 272 (which also corresponds to the fall signal 306) and the feedback signal 252 in the edge selector 130. FIG. 3B also illustrates the signals 312-320 along the upper path in the data sampler 132, while FIG. 3C also illustrates the signals 332-340 along the lower path in the data sampler 132.

Figure 4:
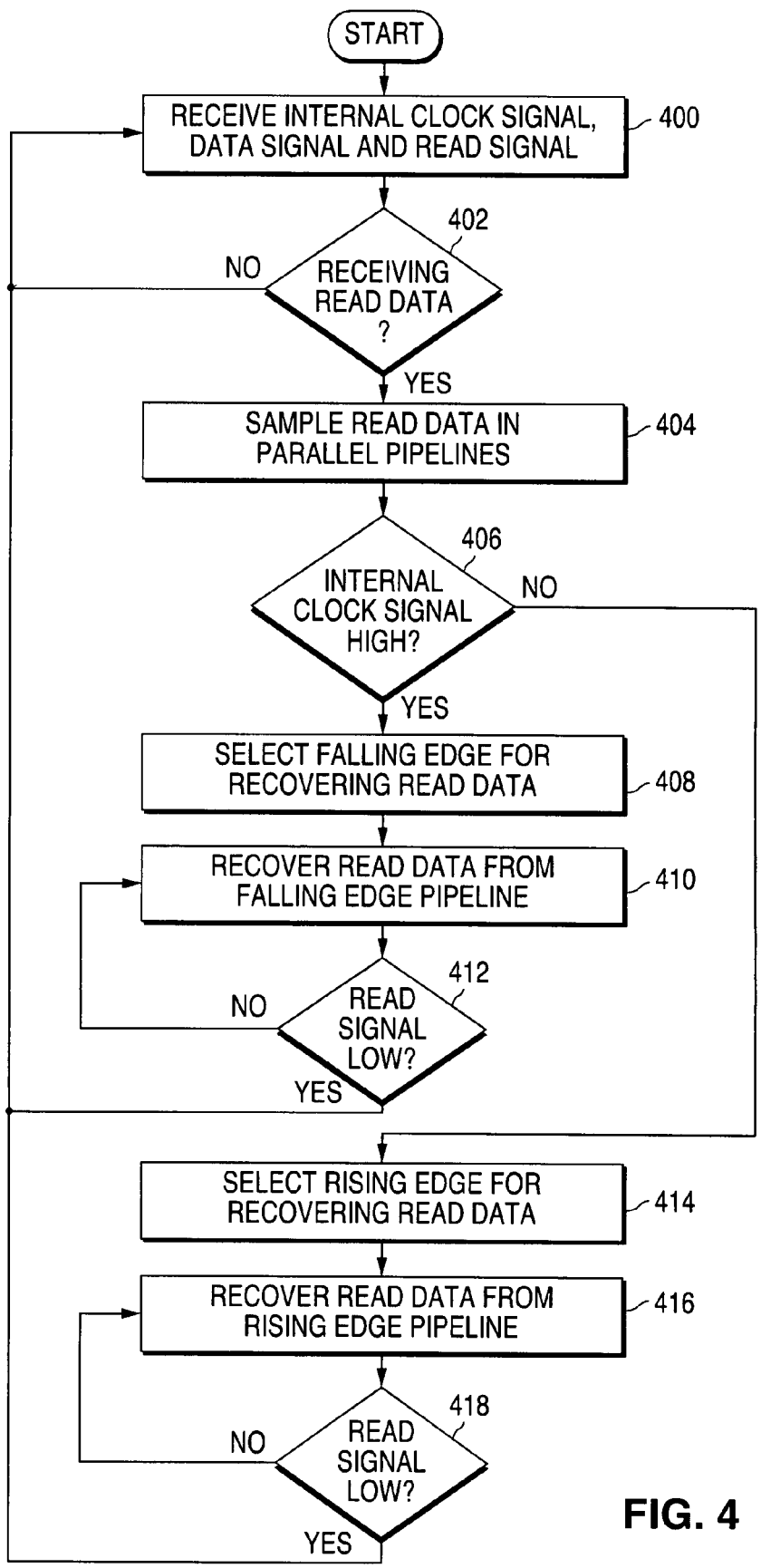
FIG. 4 is a flow diagram illustrating a method for dynamically selecting a clock edge for read data recovery using the interface of FIG. 1 in accordance with one embodiment of the present invention.

FIG. 4 is a flow diagram illustrating a method for dynamically selecting a clock edge for read data recovery using the master-slave interface 100 in accordance with one embodiment of the present invention. The method begins at step 400 where the edge selector 130 receives the internal clock signal 202, a data signal 204, and a read signal 206. For the described embodiment, before read data is received as a data signal 204, both the data signal 204 and the read signal 206 are low.

At decisional step 402, the edge selector 130 determines whether or not read data is being received in the data signal 204. For example, when read data begins to be received, the first bit of data received in the data signal 204 is high, which corresponds to a Start bit. This Start bit indicates that read data is following on the data signal 204 line. In addition, the read signal 206 goes from low to high when read data is being received. Thus, for this embodiment, while the data signal 204 and the read signal 206 remain low, the edge selector 130 determines that read data is not being received. When both the data signal 204 and the read signal 206 go from low to high, the edge selector 130 determines that read data is being received.

If the edge selector 130 determines that read data is not being received, the method follows the No branch from decisional step 402 and returns to step 400 where the edge selector 130 continues to receive the internal clock signal 202, the data signal 204, and the read signal 206.

However, if the edge selector 130 determines that read data is being received, the method follows the Yes branch from decisional step 402 to step 404. At step 404, the data sampler 132 begins to sample the read data as the data signal 302 in parallel pipelines 370 and 372 in order to provide the edge selector 130 with sufficient time to determine whether to recover the read data using the rising edge or the falling edge of the internal clock signal 202.

At decisional step 406, the edge selector 130 determines whether or not the internal clock signal 202 was high when the edge selector 130 began receiving the read data. If the internal clock signal 202 was high when the edge selector 130 began receiving the read data, the method follows the Yes branch from decisional step 406 to step 408.

At step 408, the edge selector 130 selects the falling edge of the internal clock signal 202 for recovering read data. At step 410, the data sampler 132 begins recovering the read data from the falling edge pipeline 372 such that the recovered read data 360 corresponds to the data signal 302 recovered using the falling edge of the internal clock signal 202.

At decisional step 412, the edge selector 130 determines whether or not the read signal 206 has gone from high to low. If the read signal 206 has not gone from high to low, the method follows the No branch from decisional step 412 and returns to step 410 where the data sampler 132 continues to recover the read data from the falling edge pipeline 372. However, if the read signal 206 has gone from high to low, the read data for the current read operation has been recovered and the method follows the Yes branch from decisional step 412 and returns to step 400 where the edge selector 130 is re-armed and continues to receive signals 202, 204 and 206 while waiting for another read operation.

Returning to decisional step 406, if the internal clock signal 202 was not high when the edge selector 130 began receiving the read data, the method follows the No branch from decisional step 406 to step 414.

At step 414, the edge selector 130 selects the rising edge of the internal clock signal 202 for recovering read data. At step 416, the data sampler 132 begins recovering the read data from the rising edge pipeline 370 such that the recovered read data 360 corresponds to the data signal 302 recovered using the rising edge of the internal clock signal 202.

At decisional step 418, the edge selector 130 determines whether or not the read signal 206 has gone from high to low. If the read signal 206 has not gone from high to low, the method follows the No branch from decisional step 418 and returns to step 416 where the data sampler 132 continues to recover the read data from the rising edge pipeline 370. However, if the read signal 206 has gone from high to low, the read data for the current read operation has been recovered and the method follows the Yes branch from decisional step 418 and returns to step 400 where the edge selector 130 is re-armed and continues to receive signals 202, 204 and 206 while waiting for another read operation.

Although the present invention has been described with several embodiments, various changes and modifications may be suggested to one skilled in the art. It is intended that the present invention encompass such changes and modifications as fall within the scope of the appended claims.

What is claimed is:

1. A method for dynamically selecting a clock edge for recovering read data, comprising:
    determining whether an internal clock signal is high when a first bit of read data is received; and
    selecting either a falling edge or a rising edge of the internal clock signal for recovering the read data based on the determination of whether the internal clock signal is high when the first bit of read data is received;
    wherein selecting either the falling edge or the rising edge of the internal clock signal comprises (i) selecting one of the falling edge and the rising edge of the internal clock signal in response to determining that the internal clock signal is high when the first bit of read data is received and (ii) selecting another of the falling edge and the rising edge of the internal clock signal in response to determining that the internal clock signal is not high when the first bit of read data is received.

2. The method of claim 1, wherein selecting either the falling edge or the rising edge of the internal clock signal comprises selecting the rising edge of the internal clock signal for recovering the read data when the internal clock signal is determined to be high when the first bit of read data is received.

3. The method of claim 2, wherein selecting either the falling edge or the rising edge of the internal clock signal further comprises selecting the falling edge of the internal clock signal for recovering the read data when the internal clock signal is determined not to be high when the first bit of read data is received.

4. The method of claim 1, further comprising:
    sampling the read data in a rising edge pipeline and in a falling edge pipeline;
    recovering the read data from the rising edge pipeline when the rising edge of the internal clock signal is selected for recovering the read data; and
    recovering the read data from the falling edge pipeline when the falling edge of the internal clock signal is selected for recovering the read data.

5. The method of claim 4, further comprising:
    determining whether the internal clock signal is high when a first bit of a second set of read data is received; and
    selecting either the falling edge or the rising edge of the internal clock signal for recovering the second set of read data based on the determination of whether the internal clock signal is high when the first bit of the second set of read data is received.

6. In a master-slave interface, a master operable to dynamically select a clock edge for recovering read data from a slave, the master comprising:
    an edge selector operable to determine whether an internal clock signal is high when a first bit of read data is received, the edge selector also operable to select either a falling edge or a rising edge of the internal clock signal for recovering the read data based on the determination of whether the internal clock signal is high when the first bit of read data is received; and
    a data sampler coupled to the edge selector, the data sampler operable to recover the read data based on the selected edge of the internal clock signal;
    wherein the edge selector is operable to (i) select one of the falling edge and the rising edge of the internal clock signal in response to determining that the internal clock signal is high when the first bit of read data is received and (ii) select another of the falling edge and the rising edge of the internal clock signal in response to determining that the internal clock signal is not high when the first bit of read data is received.

7. The master of claim 6, wherein the edge selector is operable to select the rising edge of the internal clock signal for recovering the read data when the internal clock signal is determined to be high when the first bit of read data is received.

8. The master of claim 7, wherein the edge selector is further operable to select the falling edge of the internal clock signal for recovering the read data when the internal clock signal is determined not to be high when the first bit of read data is received.

9. The master of claim 6, wherein the data sampler is further operable to:
   sample the read data in a rising edge pipeline and in a falling edge pipeline;
   recover the read data from the rising edge pipeline when the rising edge of the internal clock signal is selected for recovering the read data; and
   recover the read data from the falling edge pipeline when the falling edge of the internal clock signal is selected for recovering the read data.

10. The master of claim 9, wherein the edge selector is further operable to:
    determine whether the internal clock signal is high when a first bit of a second set of read data is received; and
    select either the falling edge or the rising edge of the internal clock signal for recovering the second set of read data based on the determination of whether the internal clock signal is high when the first bit of the second set of read data is received.

11. The master of claim 6, wherein the edge selector comprises:
    a first AND gate operable to AND the internal clock signal with a data signal to generate an output;
    a first flip-flop and a second flip-flop operable to delay the output of the first AND gate;
    a second AND gate operable to AND an inversion of the internal clock signal with the data signal to generate an output;
    a third flip-flop and a fourth flip-flop operable to delay the output of the second AND gate, wherein the first, second, third and fourth flip-flops are operable to be clocked with a selector clock signal comprising a frequency of approximately twice the internal clock signal;
    a three-input OR gate operable to OR the delayed outputs of the first and second AND gates and a feedback signal to generate an output;
    a third AND gate operable to AND the output of the OR gate and a read signal to generate an output;
    a fifth flip-flop operable to delay the output of the third AND gate, the delayed output of the third AND gate comprising the feedback signal;
    a multiplexer operable to select between the delayed output of the first AND gate and a fall signal based on the delayed output of the third AND gate; and
    a sixth flip-flop operable to delay the selection of the multiplexer to generate the fall signal, wherein the edge selector is operable to select the falling edge or the rising edge based on the fall signal.

12. The master of claim 6, wherein the data sampler comprises a rising edge pipeline operable to sample the read data using the rising edge of the internal clock signal and a falling edge pipeline operable to sample the read data using the falling edge of the internal clock signal.

13. The master of claim 12, wherein:
    the rising edge pipeline comprises three flip-flops operable to be clocked using the internal clock signal; and
    the falling edge pipeline comprises two flip-flops operable to be clocked using an inversion of the internal clock signal and one flip-flop operable to be clocked using the internal clock signal.

14. The master of claim 12, wherein the edge selector is further operable to generate a fall signal, the fall signal comprising the selection of either the rising edge of the internal clock signal or the falling edge of the internal clock signal, the data sampler further comprising a multiplexer operable to select the read data from one of the rising edge pipeline and the falling edge pipeline based on a read signal and the fall signal.

15. A master-slave interface, comprising:
    a slave operable to store data in a slave memory; and
    a master operable to receive read data stored in the slave memory from the slave, to determine whether an internal clock signal is high when a first bit of the read data is received at the master, and to select either a falling edge or a rising edge of the internal clock signal for recovering the read data based on the determination of whether the internal clock signal is high when the first bit of read data is received at the master;
    wherein the master is operable to (i) select one of the falling edge and the rising edge of the internal clock signal in response to determining that the internal clock signal is high when the first bit of read data is received and (ii) select another of the falling edge and the rising edge of the internal clock signal in response to determining that the internal clock signal is not high when the first bit of read data is received.

16. The interface of claim 15, wherein the master is further operable to sample the read data in a rising edge pipeline and in a falling edge pipeline, to recover the read data from the rising edge pipeline when the rising edge of the internal clock signal is selected for recovering the read data, and to recover the read data from the falling edge pipeline when the falling edge of the internal clock signal is selected for recovering the read data.

17. The interface of claim 16, wherein the master is further operable to:
    determine whether the internal clock signal is high when a first bit of a second set of read data is received at the master; and
    select either the falling edge or the rising edge of the internal clock signal for recovering the second set of read data based on the determination of whether the internal clock signal is high when the first bit of the second set of read data is received at the master.

18. The interface of claim 15, wherein the master comprises a baseband processor, and the slave comprises a display.

19. The interface of claim 15, further comprising a link operable to couple the master to the slave and to transfer the read data from the slave to the master.

20. The interface of claim 19, wherein the link comprises a flex interconnect.

* * * * *